United States Patent [19]
Okeshi et al.

[11] Patent Number: 5,880,553
[45] Date of Patent: Mar. 9, 1999

[54] ELECTRONIC COMPONENT AND METHOD OF PRODUCING SAME

[75] Inventors: Motoyuki Okeshi, Shiga-ken; Ken Taniguchi, Moriyama; Takashi Hashimoto; Makoto Irie, both of Toyama; Hiroyuki Kawakami, Toyama-ken; Choichiro Fujii, Kyoto; Michinobu Maesaka; Hidemasa Iwami, both of Omihachiman; Takashi Iwamoto, Otsu, all of Japan

[73] Assignee: Murata Manufacturing Co.,Ltd., Kyoto-fu, Japan

[21] Appl. No.: 856,925

[22] Filed: May 15, 1997

[30] Foreign Application Priority Data

| May 15, 1996 | [JP] | Japan | 8-146585 |
| Aug. 9, 1996 | [JP] | Japan | 8-227416 |
| Dec. 3, 1996 | [JP] | Japan | 8-339072 |

[51] Int. Cl.$^6$ ............................................. H01L 41/08
[52] U.S. Cl. ........................... 310/352; 310/344; 310/354
[58] Field of Search ......................... 310/344, 348, 310/351, 352, 354, 355

[56] References Cited

U.S. PATENT DOCUMENTS

| 2,133,643 | 10/1938 | Pierce | 310/348 X |
| 2,467,353 | 4/1949 | Wolfskill | 310/356 |
| 3,348,078 | 10/1967 | Nagata et al. | 310/356 |
| 3,805,348 | 4/1974 | Nagata et al. | 310/352 X |
| 3,969,640 | 7/1976 | Staudte | 310/344 X |
| 4,035,673 | 7/1977 | Ishida et al. | 310/344 |
| 4,191,905 | 3/1980 | Yasuda et al. | 310/344 |
| 4,899,076 | 2/1990 | Kato | 210/356 |
| 5,250,870 | 10/1993 | Fenlon et al. | 310/352 X |
| 5,392,012 | 2/1995 | Iwata et al. | 310/348 X |
| 5,459,368 | 10/1995 | Onishi et al. | 310/344 X |
| 5,699,027 | 12/1997 | Tsuji et al. | 310/344 X |

*Primary Examiner*—Mark O. Budd
*Attorney, Agent, or Firm*—Graham & James LLP

[57] ABSTRACT

An electronic component has a substantially reduced size and is adapted to be produced at low costs without variation in superior quality of the component because of the ease of achieving electrical connection between a piezoelectric element and a electrode pattern on a substrate supporting the piezoelectric element. The piezoelectric element has a lower electrode formed on the lower surface thereof and an upper electrode formed on the upper surface thereof. The piezoelectric element is fixed to the substrate such that the lower electrode is bonded to an electrode provided on the substrate by a conductive adhesive. A conductive wire is fixed to the upper electrode of the piezoelectric element. A metallic cap is bonded to the substrate so as to cover and seal the piezoelectric element on the substrate. The cap is contacted at its inner surface by the wire, whereby an electrical connection is achieved between the cap and the upper electrode of the piezoelectric element. Input and output lead terminals are connected to the electrodes on the substrate, while a grounding lead terminal is connected to the cap.

16 Claims, 11 Drawing Sheets

ELECTRONIC COMPONENT AND METHOD OF PRODUCING SAME

BACKGROUND OF THE INVENTION

1. Field of the Invention

The present invention relates to an electronic component such as, for example, a piezoelectric component and, more particularly but not exclusively, to a surface-mount type electronic component. The present invention also relates to a method of producing such an electronic part.

2. Description of the Related Art

A surface-mount type electronic component, specifically a piezoelectric component, of the type shown in FIGS. 1 and 2 is known. This electronic component incorporates an element 4 which makes use of piezoelectric vibration (referred to as "piezoelectric element"). The piezoelectric element 4 includes electrodes 4a and 4b disposed on upper and lower major surfaces thereof and is arranged to vibrate in a longitudinal vibration mode. Pattern electrodes 2 and 3 are provided on a substrate 1 which supports the piezoelectric element 4. The lower electrode 4b disposed on the lower major surface of the piezoelectric element 4 is connected and fixed to a first one 2 of the pattern electrodes by a conductive adhesive 5. The upper electrode 4a disposed on the upper major surface of the piezoelectric element 4 is connected to the other pattern electrode 3 by a wire 6. A cap 7 is attached to the upper surface of the substrate 1 so as to cover and seal the piezoelectric element 4.

In the piezoelectric component shown in FIG. 1, the upper electrode 4a of the piezoelectric element 4 and the pattern electrode 3 disposed on the substrate 1 are connected to each other by a wire bonding technique. It has been difficult, however, to optimize the wire-bonding process and resulting structural arrangement due to the difference in height or vertical location between the electrode 4a of the piezoelectric element 4 and the pattern electrode 3 disposed on the substrate 1.

When a capillary is moved while the wire 6 is being connected to one of these electrodes 3 and 4a, it is necessary to optimize the length of feed of the wire 6. If a feed length of the wire 6 is too small, the wire 6 may contact an edge of the piezoelectric element 4 as shown in FIG. 3, resulting in troubles such as cutting of the wire 6 or impairment of the electrical characteristics of the piezoelectric element 4. Conversely, if the feed length of the wire 6 is too large, this causes problems such as the wire 6 sagging downwardly as shown in FIG. 4, with the result that the wire 6 contacts the piezoelectric element 4 to impair electrical characteristics of the element 4.

For these reasons, mass-production of electronic components requiring wire bonding involves great manufacturing difficulty and experiences significant fluctuation of the quality.

Another problem is that the size of the electronic component must be large because of the need to provide a space between the substrate 1 and the cap 7 for accommodating the wire 6 which interconnects the upper electrode 4a of the piezoelectric element 4 and the pattern electrode 3 disposed on the substrate 1.

In the meantime, electronic components having lead terminals suffer from the following problem. In general, an electronic component, specifically of the type in which a circuit element is sealed with a resin without being constrained by the resin, has such a structure as that disclosed in Japanese Patent Publication No. 1-48695, wherein lead terminals are electrically connected to the corresponding electrodes of the circuit element and, after the circuit element is enclosed in a case with the lead electrodes extending externally through openings formed in the case wall, these openings are sealed by a sealing resin.

This type of structure, however, requires that different design configurations of the openings be provided in conformity with the shapes of the lead terminals, at the time of design of the products. In addition, it is necessary to apply a sealing resin to each of the openings in a one-by-one fashion. This causes an impediment to mass-production of the electronic parts, thus raising the costs of production.

Prior to the application of the sealing resin, since the lead terminals are directly connected to the circuit element, any load or external force tends to be directly transmitted to the circuit element, often resulting in breakage or cracking of the circuit element especially when the circuit element is a fragile one such as a piezoelectric element. Consequently, throughput is lowered and the number of acceptable components manufactured is substantially reduced.

SUMMARY OF THE INVENTION

The preferred embodiments of the present invention provide an electronic component which allows for easy electrical connection between a circuit element and an electrode pattern on a substrate supporting the circuit element, thus providing stabilization of quality of the electronic components at reduced costs, as well as reduction in the size of the electronic component. The preferred embodiments of the present invention also provide a method for producing such an electronic component having these advantages.

The preferred embodiments of the present invention also provide an electronic component which is easily mass-producible at low costs and which has a structure which allows for completely sealing a circuit element of the electronic component while suppressing an application of load to the circuit element to prevent damage to the circuit element and deterioration of the electrical characteristics of the electronic component.

According to one preferred embodiment of the present invention, an electronic component comprises: an insulating substrate having an electrode pattern provided thereon; a circuit element mounted on the insulating substrate; and a cap bonded to the substrate so as to cover and seal the circuit element; wherein a conductive portion is provided on at least the inner surface of the cap, the conductive portion being connected to an electrode of the circuit element and also to the electrode pattern on the substrate, whereby the electrode of the circuit element is electrically connected to the electrode pattern on the substrate through the conductive portion of the cap.

In accordance with the preferred embodiments of the present invention, the cap preferably is used as a part of the electrical connection, for the purpose of achieving electrical connection between an electrode of the circuit element and the electrode pattern provided on the substrate. This connecting method considerably facilitates the establishment of an electrical connection between the circuit element and the electrode pattern on the substrate, as compared with the wire bonding method which has previously been used, thereby contributing to reduction in the costs and stabilization of the quality of the electronic component being manufactured. Furthermore, the size of the cap and, hence, the size of the whole electronic component, can be reduced because of elimination of the necessity for providing a wiring space which has previously been required in order to establish electrical connection between the electrode on the surface of the circuit element and the electrode on the substrate.

The conductive portion of the cap may be provided by forming the whole cap from a metallic material such as aluminum, copper or the like. Alternatively, the cap may be formed from an insulating material such as ceramics or resin, and a conductive film may be disposed at least on the inner surface of the cap by a suitable technique such as sputtering, evaporation deposition, printing or the like.

When the circuit element is a piezoelectric element which is provided at its upper and lower major surfaces with electrodes and which makes use of piezoelectric vibration, the arrangement is preferably such that the connection to the conductive portion of the cap is made at a region of the electrode on the upper surface of the circuit element near a nodal point of the vibration. Such an arrangement does not inhibit vibration of the piezoelectric element and, therefore, does not impair the electrical characteristics of the electronic component, because the conductive material which interconnects the conductive portion of the cap and the electrode on the surface of the piezoelectric element is preferably located in a region near the nodal point which is free of vibration.

In general, there are a plurality of vibration modes of piezoelectric vibration, such as longitudinal vibration mode, radial vibration mode, and so forth. In each of these modes, the nodal point is located at the centers of the upper and lower surfaces of the piezoelectric substrate. It is therefore preferred that the piezoelectric element is fixed to the substrate substantially at the approximate center of the lower surface thereof and is connected to the cap inner surface substantially at the approximate center of the upper surface thereof.

The electronic component in accordance with the preferred embodiments of the present invention is preferably but not exclusively a piezoelectric component.

According to another preferred embodiment of the present invention, there is provided a piezoelectric component, comprising: a substrate having an electrode disposed on the upper surface thereof; a piezoelectric element having electrodes disposed on upper and lower major surfaces thereof and mounted on the substrate, the electrode on the lower surface of the piezoelectric element being electrically connected to the electrode on the substrate; and a cap made of a metallic material and bonded to the substrate so as to cover and seal the piezoelectric element; and a conductive wire provided on the electrode on the upper surface of the piezoelectric element; the cap being placed so as to cover the piezoelectric while making contact at the inner surface thereof with the conductive wire, whereby the electrode on the upper surface of the piezoelectric element is electrically connected to the cap through the conductive wire.

According to still another preferred embodiment of the present invention, there is provided a method of producing a piezoelectric component of the type having a substrate with an electrode disposed thereon, a piezoelectric element having electrodes provided on upper and lower surfaces thereof and mounted on the substrate, and a cap bonded to the substrate so as to cover and seal the piezoelectric element, the method comprising the steps of: fixing the piezoelectric element on the substrate such that the electrode on the lower surface of the piezoelectric element is connected to the electrode of the substrate; fixing a conductive wire to the electrode on the upper surface of the piezoelectric element; applying a conductive adhesive to the portion of the inner surface of the cap for contacting with the conductive wire; applying a sealing adhesive to an opening of the cap; placing the cap on the substrate such that the conductive wire contacts the inner surface of the cap to cause a portion of the conductive wire to contact with the conductive adhesive; and simultaneously curing the sealing resin and the conductive adhesive.

In these preferred embodiments of the present invention, electrical connection between the electrode disposed on the upper surface of the piezoelectric element and the cap is preferably achieved by a wire which is fixed on the electrode on the upper surface of the piezoelectric element and which is pressed against the inner surface of the cap. The wire may be formed by a known technique such as that used in wire bonding technique. If the position at which the wire is fixed to the piezoelectric element is determined to be the vibration-free portion of the piezoelectric element, there is no substantial risk that the vibration is impeded, unlike the case where a conductive adhesive used as the connecting material is spread over a wide area to impede vibration of the piezoelectric element. In addition, any thermal stress produced as a result of difference in thermal expansion between different materials is effectively absorbed by the elastic nature of the wire, so that electrical conduction can stably be maintained with a high degree of reliability. The elastic nature of the wire also serves to absorb any fluctuation in the size of the gap between the cap and the piezoelectric element, which provides a greater tolerance in the administration of dimensions.

Preferably, the wire has a loop-like form and is preferably fixed at both ends to the electrode on the upper surface of the piezoelectric element. Such a loop shape provides a large elasticity so as to ensure stable contact between the cap and the wire. The loop-shaped wire can withstand long use with reduced risk of cutting or sagging down, thus offering a high degree of reliability and eliminating the problems of the prior art wire connections. The wire may be formed by using a known technique such as that used in a wire bonding method. Since the points on the electrode on the upper surface of the piezoelectric element to which the ends of the loop-shaped wire are connected are almost at the same vertical level, an optimum condition for achieving electrical connection can be determined without difficulty.

Preferably, the whole cap is made of a metallic material having excellent electrical conductivity, such as aluminum, copper or the like.

The piezoelectric element may be adapted to vibrate in any vibration mode. It is, however, preferred that the wire is fixed to a portion of the piezoelectric element which is free of vibration or a region near such a vibration-free point. In case of a piezoelectric element having a nodal point, e.g., a piezoelectric element using longitudinal vibration mode or radial vibration mode, it is recommended that the wire is fixed to such a nodal point. Similarly, the portion of the lower side of the piezoelectric element at which the element is fixed to the substrate electrode should be a portion which is free of vibration.

Although electrical connection can be achieved merely by bringing the cap into contact with the wire, it is preferred that a conductive adhesive be applied to the portion of the cap inner surface where the contact with the wire occurs, if a specifically low level of resistance and high level of reliability are desired. In such a case, the amount of the conductive adhesive to be applied should be determined such that the adhesive contacts with the wire alone, i.e., the adhesive does not contact the piezoelectric element, in order to avoid restriction of vibration of the piezoelectric element.

Preferably, the electrode on the substrate extends externally and a first lead terminal is connected to this externally led portion of the substrate electrode, while a second lead terminal is connected and fixed to the outer surface of the cap. In this case, the electrode disposed on the upper surface of the piezoelectric element is preferably directly connected to the lead terminal through the cap, without using the intermediary of the electrode on the substrate, whereby a piezoelectric component of the lead-terminal type having a simple construction for external connection can be obtained.

It is also possible to obtain a surface-mount type piezoelectric component, by forming an input/output electrode and a grounding electrode on the substrate and externally extending the electrodes through a region where the cap is bonded, with the input/output electrode connected to the electrode on the lower side of the piezoelectric element, while connecting the cap to the grounding electrode.

According to a further preferred embodiment of the present invention, there is provided an electronic part, comprising: an insulating substrate having pattern electrodes provided thereon; a circuit element mounted on the surface of the substrate and having electrodes electrically connected to the pattern electrodes; a cap bonded to the surface of the substrate so as to cover and seal the circuit element; and lead terminals electrically connected to portions of the pattern electrodes which extend externally from the cap; wherein the cap is made of an electrically conductive material and is electrically connected to one of the electrodes of the circuit element and with at least one of the lead terminals.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
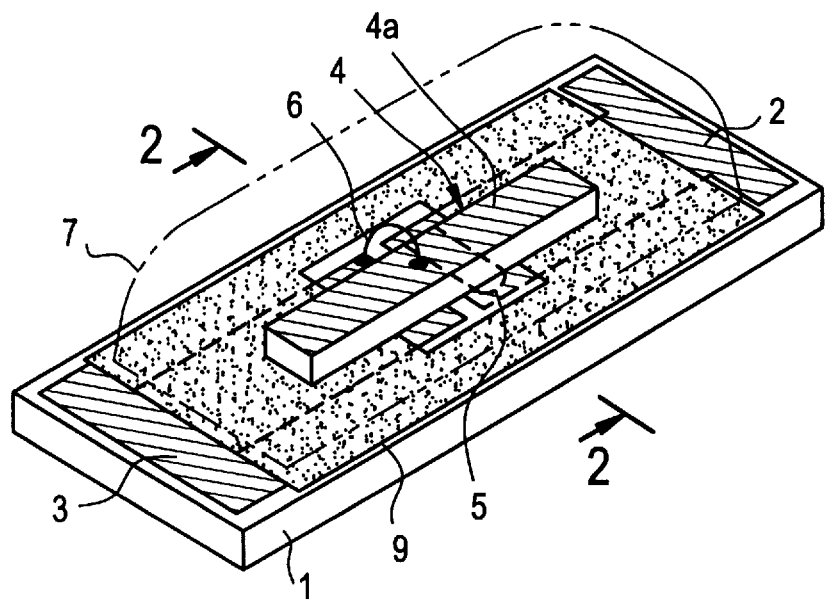
FIG. 1 is a perspective view of an electronic component having problems to be overcome by the preferred embodiments of the present invention.
Figure 2:
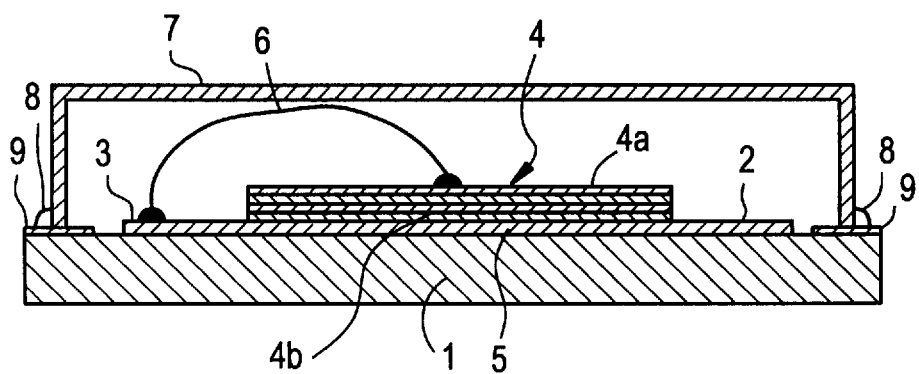
FIG. 2 is a sectional view of the electronic component taken along the line A—A of FIG. 1.
Figure 3:
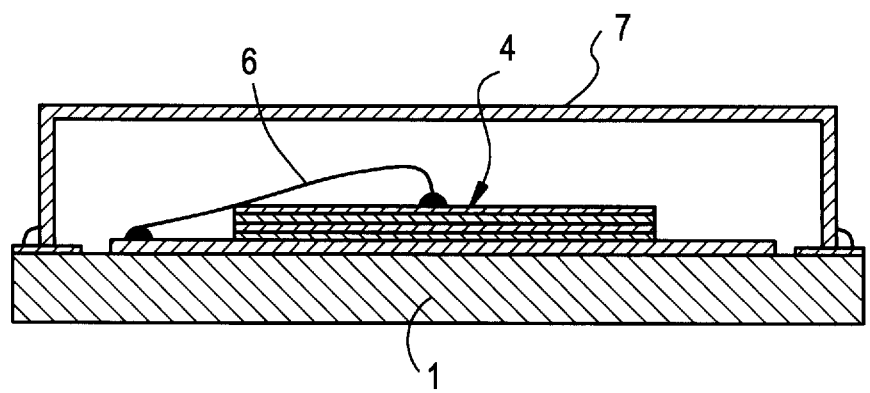
FIG. 3 is a sectional view of the electronic component taken along the line A—A of FIG. 1, illustrative of an example of wiring failure.
Figure 4:
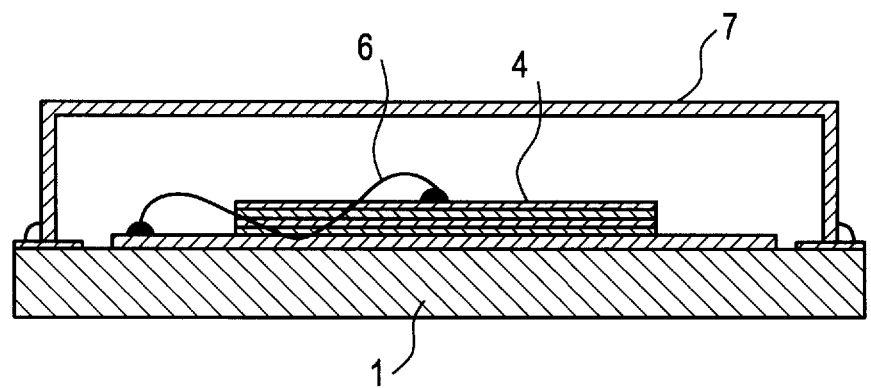
FIG. 4 is a sectional view of the electronic component taken along the line A—A of FIG. 1, illustrative of another example of wiring failure.
Figure 5:
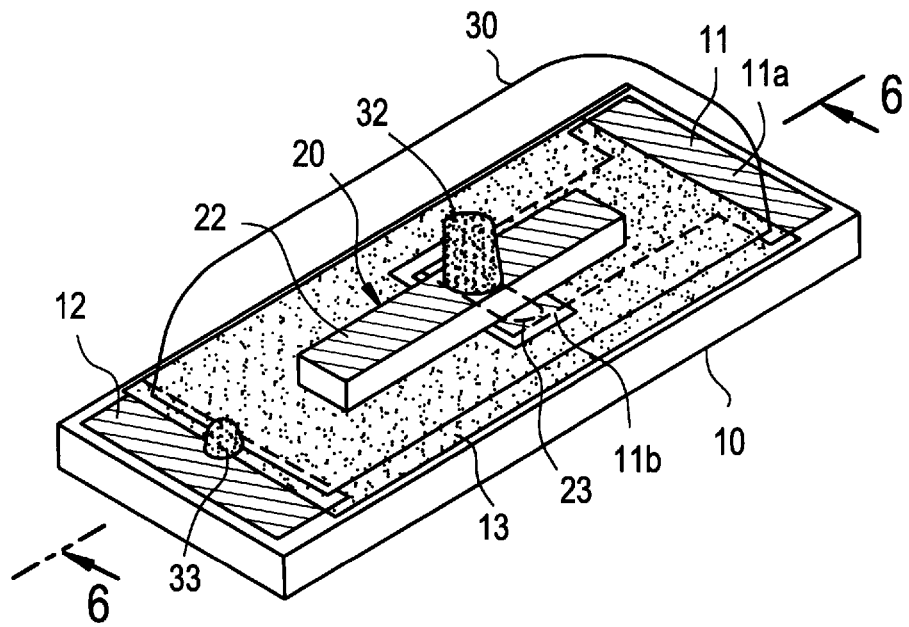
FIG. 5 is a perspective view of a first preferred embodiment of the electronic component in accordance with the present invention.
Figure 6:
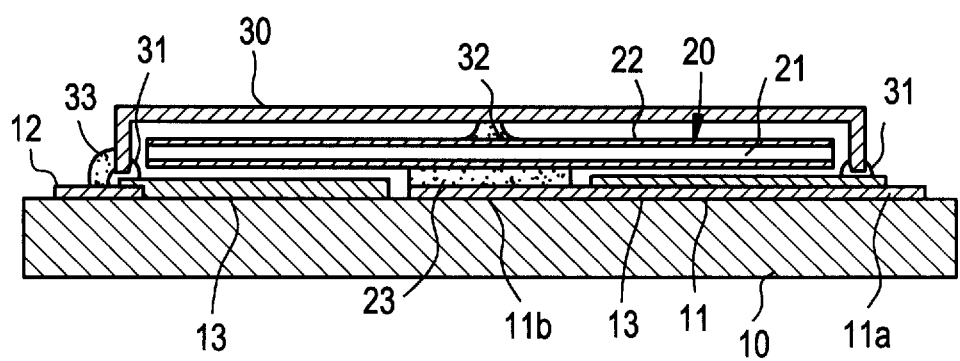
FIG. 6 is a sectional view of the electronic component taken along the line B—B of FIG. 5.

FIGS. 5 and 6 show an electronic component as the first preferred embodiment of the present invention. As in the case of the electronic component shown in FIG. 1 described before, the electronic component shown in FIGS. 5 and 6 has a substrate 10, a piezoelectric element 20 and a cap 30.

The substrate 10 is preferably a substantially rectangular thin sheet member made of an alumina ceramics, a glass epoxy resin, or the like. A pair of pattern electrodes 11, 12 are disposed on the upper surface of the substrate 10 by a known technique such as sputtering, evaporation, printing or the like. One 11 of the electrodes has an external connecting portion 11a which is formed to extend preferably in a belt-like arrangement along one shorter side of the substrate 10, and an internal connecting portion 11b which extends inwardly towards the center of the substrate 10 from the external connecting portion 11a substantially perpendicularly thereto. The other electrode 12 is arranged in a belt-like arrangement so as to extend along the other shorter side of the substrate 10.

A frame-shaped insulating layer 13, e.g., an insulating resist pattern, is provided on the upper surface of the substrate 10 so as to overlie the electrodes 11, 12. The internal connecting portion 11b of one of the pattern electrodes 11 is exposed at the central open area of the insulating layer 13. The insulating layer 13 prevents shortcircuiting between the pattern electrode 11 on the substrate 10 and the metallic cap 30, and also compensates for any height variation or unevenness of the surface of the substrate 10 caused by the thickness of the electrodes 11, 12, thus preventing any sealing failure of the cap 30.

The piezoelectric element 20 may be a piezoelectric filter or a piezoelectric oscillator which is arranged to vibrate in the longitudinal vibration mode. The piezoelectric element 20 has a substantially rectangular piezoelectric ceramics plate which includes electrodes 21, 22 preferably formed so as to extend over the entire areas of the upper and lower surfaces of the plate. The central portion of the electrode 21 (referred to as "lower electrode", hereinafter) disposed on the lower surface of the piezoelectric element 20 is connected and fixed preferably by a conductive adhesive 23 to the internal connecting portion 11*b* of the pattern electrode 11 which is exposed at the central open area of the insulating layer 13. To this end, for example, the conductive adhesive 23 may be applied by a dispenser or by printing, and the element 20 is placed on the adhesive, followed by heating at approximately 150° C. for 30 minutes to cause the conductive adhesive 23 to cure. It is thus possible to fix the element 20 to the substrate 10, while achieving electrical connection between the electrode 11 of the substrate 10 and the lower electrode 21 of the element 20. Small gaps are left between both ends of the element 20 and the insulating layer 13 so that these ends of the element 20 do not contact with the insulating layer 13.

A metallic cap 30 is bonded to the upper surface of the substrate 10 so as to cover and seal the element 20. A suitable material such as a sealing adhesive 31 is applied to the rim of opening of the cap 30 at a uniform thickness by transferring method, for example. A conductive adhesive 32 is preferably applied by a dispenser to the electrode 22 (referred to as "upper electrode") disposed on the upper surface of the piezoelectric element 20, preferably to the nodal point or to a portion in the central region near the nodal point. The amount of application of the conductive adhesive 32 is preferably adjusted to accommodate the clearance between the upper electrode 22 of the element 20 and the inner surface of the cap 30, such that the adhesive 32 does not excessively spread on the element 20. When the cap 30 is placed on the substrate 13, the rim of opening of the cap 30 closely contacts the insulating layer 13 disposed on the substrate 10, while the inner surface of the cap 30 contacts the upper electrode 22 of the element 20 through the conductive adhesive 32. Both the sealing adhesive 31 and the conductive adhesive 32 are cured by, for example, a 30-minute heating at approximately 150° C. It is thus possible to bond the cap 30 to the substrate 10 in a sealing manner and to achieve electrical connection between the upper electrode 22 of the element 20 and the cap 30.

In this preferred embodiment, since the sealing adhesive 31 is electrically insulating and since an insulating layer 13 is formed on the portion of the substrate 10 where the cap is to be bonded, electrical insulation is ensured between the cap 30 and the electrode 11 of the substrate 10. The sealing adhesive 31, however, may be a conductive adhesive.

After the bonding of the cap 30, a conductive adhesive 33 is preferably applied by a dispenser to the external surface of the cap 30 and the electrode 12 on the substrate 10. The conductive adhesive 33 is cured by heating similar to that stated above, whereby an electrical connection is achieved between the cap 30 and the electrode 12 on the substrate 10.

The application of the conductive adhesive 33 may be done before the heat curing of the sealing adhesive 31 and the conductive adhesive 32, so that the conductive adhesive 33 is heated and cured simultaneously with the sealing adhesive 31 and the conductive adhesive 32.

The lower electrode 21 of the piezoelectric element 20 is electrically connected to the pattern electrode 11 of the substrate 10 via the conductive adhesive 23, while the upper electrode 2 of the same is electrically connected to the pattern electrode 12 on the substrate 10 via the conductive adhesive 32, cap 30 and the conductive adhesive 33, whereby a surface-mount type piezoelectric component is completed.

The process for achieving electrical connection between the piezoelectric element 20 and the pattern electrode 12 of the substrate can be done in a multiplexing manner for a large number of products, because the connection can be achieved simply by applying the conductive adhesive 32. The application of the conductive adhesive 32 can be done without generating or imparting any substantial impact which, when a wire bonding technique is used as in conventional components and processes, would be applied to the element 20. It is thus possible to attain higher efficiency for achieving electrical connection, while preventing damage to the element 20.

In this preferred embodiment, it is possible to eliminate the use of wire connections and the step of wire bonding completely. Consequently, high product quality is reliably obtained, because degradation which previously has been inevitable due to fluctuation in wire connections and wire bonding is avoided. The elimination of wiring also contributes to reduction in the overall size of the electronic component.

Figure 7:
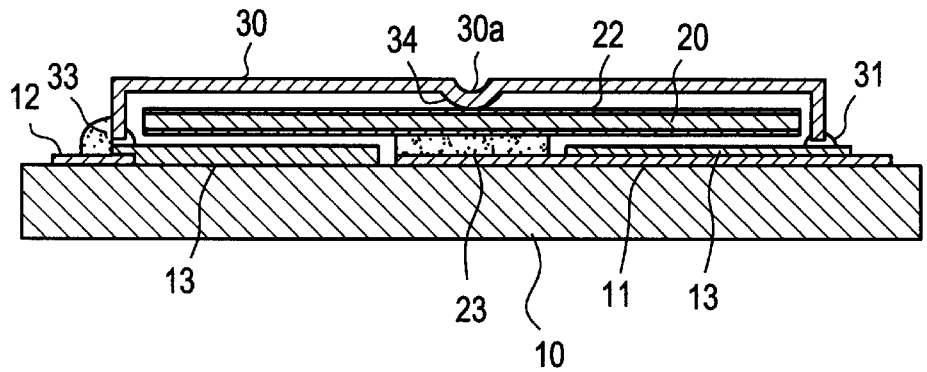
FIG. 7 is a sectional view of a second preferred embodiment of the electronic component in accordance with the present invention.

FIG. 7 shows an electronic part according to a second preferred embodiment of the present invention. In FIG. 7, the same reference numerals are used to denote the same parts or members as those of the first preferred embodiment described in connection with FIG. 6.

The second preferred embodiment features a projection 30*a* which projects inwardly preferably from the approximate center of the metallic cap 30. A cream solder 34 is preferably applied to the projection 30*a*. In the assembly of the electronic component of FIG. 7, the cap 30 is placed on the substrate 10 and is heated to a temperature at which the solder is molten, whereby the cap is connected to the upper electrode 22 of the element 20 by soldering. It is possible to use a conductive adhesive in place of the solder 34.

In this preferred embodiment, since the conductive agent (solder or conductive adhesive) 34 is concentrated on the projection 30*a*, undesirable spreading of the agent 34 over the element 20 can be prevented, despite any fluctuation in the amount of the agent 34 applied or fluctuation in the size of the clearance between the upper electrode 22 of the piezoelectric element 20 and the inner surface of the cap 30.

Figure 8:
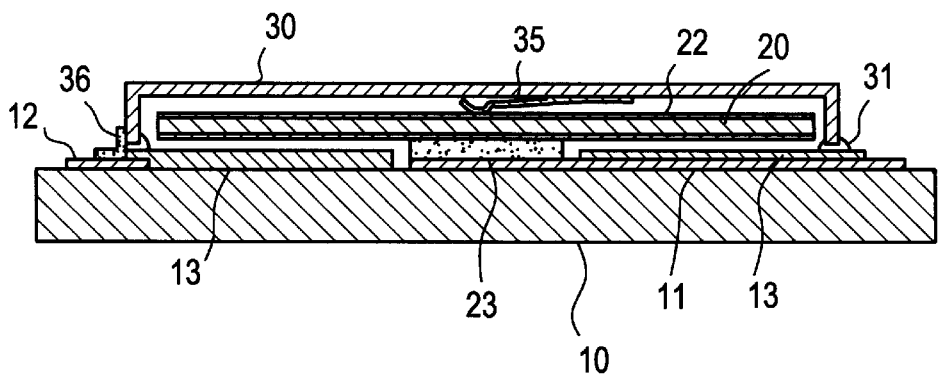
FIG. 8 is a sectional view of a third preferred embodiment of the electronic component in accordance with the present invention.

FIG. 8 shows an electronic part according to a third preferred embodiment of the present invention. In FIG. 8, the same reference numerals are used to denote the same parts or members as those of the first preferred embodiment described in connection with FIG. 6.

The third preferred embodiment has an electrically conductive spring member 35 which is fixed preferably by welding to the central portion of the inner surface of the cap 30, while the other ends of the spring member 35 resiliently contact the approximate central portion of the upper electrode 22, thus achieving the electrical connection. In the production of this electronic part, it is preferred to apply a force to keep the cap 30 in contact with the substrate 10 until the adhesive is cured, in order to prevent the cap 30 from being moved apart from the substrate 10 by the force of the spring member 35.

In the third preferred embodiment as described, the electrical connection between the piezoelectric element 20 and the cap 30 can be achieved without requiring any heat treatment, so that influence of heat on the element 20 can be reduced. In addition, since the spring member 35 effectively absorbs any fluctuation of the size of clearance between the piezoelectric element 20 and the cap 30, greater tolerance is afforded for the dimensions of the cap 30.

A conductive tape 36 may be used in place of the conductive adhesive for achieving electrical connection between the cap 30 and the pattern electrode 12.

Figure 9:
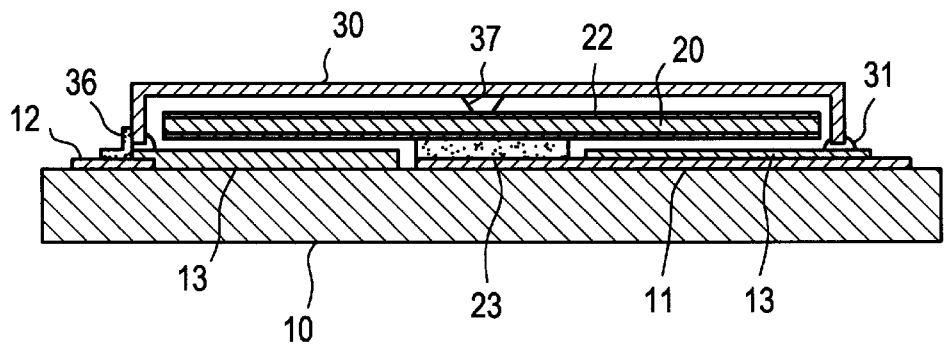
FIG. 9 is a sectional view of a fourth preferred embodiment of the electronic component in accordance with the present invention.

FIG. 9 shows an electronic part according to a fourth preferred embodiment of the present invention. In FIG. 9, the same reference numerals are used to denote the same parts or members as those of the first preferred embodiment described in connection with FIG. 6.

The fourth embodiment features a substantially U-shaped conductive wire 37 which is fixed preferably by welding at both ends thereof to an approximate central portion of the inner surface of the cap 30, with the central apex portion of the U-shaped wire 37 resiliently pressed onto a central region of the upper electrode 22 of the piezoelectric element 20. The wire 37 may be fixed to the inner surface of the cap 30 by suitable known means such as a wire bonder. This fourth preferred embodiment offers the same advantages as those presented by the third preferred embodiment.

Figure 10:
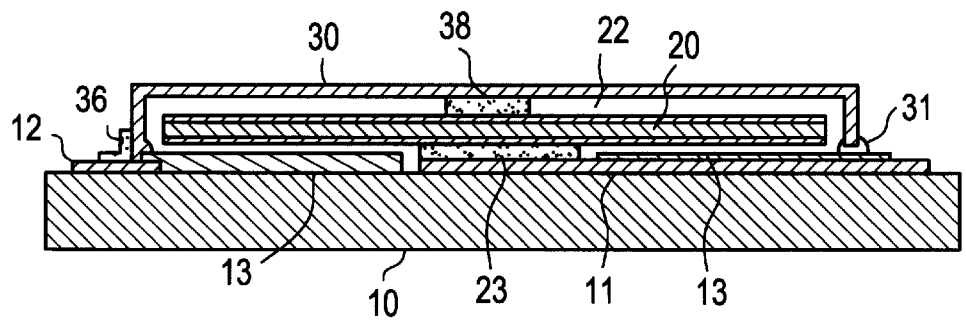
FIG. 10 is a sectional view of a fifth preferred embodiment of the electronic component in accordance with the present invention.

FIG. 10 shows an electronic component according to a fifth preferred embodiment of the present invention. In FIG. 10, the same reference numerals are used to denote the same parts or members as those of the first preferred embodiment described in connection with FIG. 6.

The fifth preferred embodiment features a conductive tape 38 which is used for achieving electrical connection between the metallic cap 30 and the upper electrode 22 of the piezoelectric element 20. The flexible nature of the conductive tape 38 is effectively used for accommodating any fluctuation in the size of the clearance between the piezoelectric element 20 and the inner surface of the cap 30.

The fifth preferred embodiment shown in FIG. 10 also eliminates wire bonding and therefore provides the same advantages as provided by the first preferred embodiment shown in FIGS. 5 and 6. This fifth preferred embodiment also offers the same advantages as those produced by the third preferred embodiment. In addition, problems such as cracking of the piezoelectric element 20 are eliminated because no pressure is applied to the piezoelectric element 20. Instead, the pressure is absorbed by the conductive tape 38.

Figure 11:
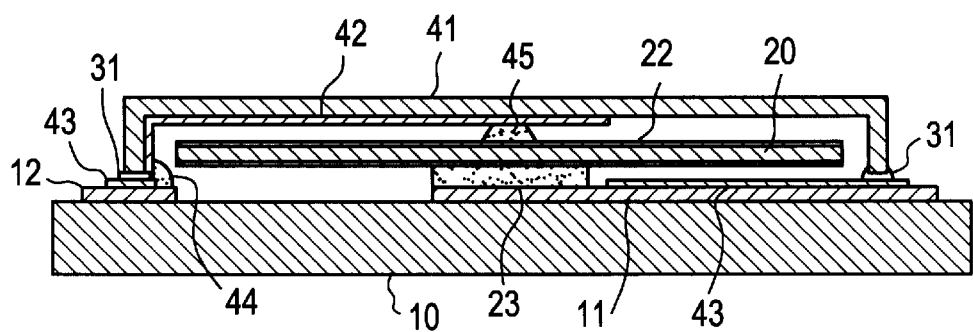
FIG. 11 is a sectional view of a sixth preferred embodiment of the electronic component in accordance with the present invention.

FIG. 11 shows an electronic component according to a sixth preferred embodiment of the present invention. In FIG. 11, the same reference numerals are used to denote the same parts or members as those of the first preferred embodiment described in connection with FIG. 6.

In the sixth preferred embodiment, a cap 41 is preferably formed of an insulating material such as alumina ceramics, resin or other suitable insulating material. A conductive portion 42 is formed on the inner surface of the cap 41 so as to extend from the approximate center to one end of the cap 41, by sputtering, evaporation deposition or other known technique. On the other hand, a preferably frame-shaped insulating layer 43 is disposed on the substrate 10. The insulating layer 43 has a small width which is substantially equal to the thickness of the wall of the cap 41.

A sealing adhesive 31 is applied to the opening rim of the cap 41 by, for example, transferring method. A conductive adhesive 44 is applied preferably by a dispenser to one end of the conductive portion 42 which extends to the open end of the cap 41. A conductive adhesive 45 is applied to the other end of the conductive portion 42 which is preferably located at the approximate center of the cap 41.

As the cap 41 is placed on the substrate 10, the cap 41 is bonded to the insulating layer 43 by the sealing adhesive 31, while the conductive portion 42 of the cap 41 is electrically connected to the pattern electrode 12 of the substrate 10 by the conductive adhesive 44. At the same time, the conductive adhesive 45 provides an electrical connection between the conductive portion 42 of the cap 41 and the upper electrode 22 of the piezoelectric element 20. As this assembly is heated to a predetermined temperature, the sealing adhesive 31 and the conductive adhesives 44, 45 are cured, whereby the upper electrode 22 of the piezoelectric element 20 is electrically connected to the pattern electrode 12 via the conductive adhesive 45, conductive portion 42 of the cap 41 and the conductive adhesive 44.

Although in the sixth preferred embodiment the conductive portion 42 extends only on the inner surface of the cap 41, the outer end of the conductive portion 42 may be extended to reach the external surface of the cap 41. In such a case, electrical connection can easily be achieved by connecting, via a conductive adhesive, the pattern electrode 12 to the end of the conductive portion 42 which is extended and disposed on the external surface of the cap 41.

In this preferred embodiment, the cap 41 is preferably made of a non-conductive material, so that the electronic part is not influenced at all by electrical noise even when other part has been brought into contact with the cap 41. In addition, if the cap 41 is made of the same material as the substrate 10, the seal between the cap 41 and the substrate 10 can be maintained despite any change in temperature, because both the cap 41 and the substrate 10 are made of the same material and exhibit the same amount of thermal expansion.

Figure 12:
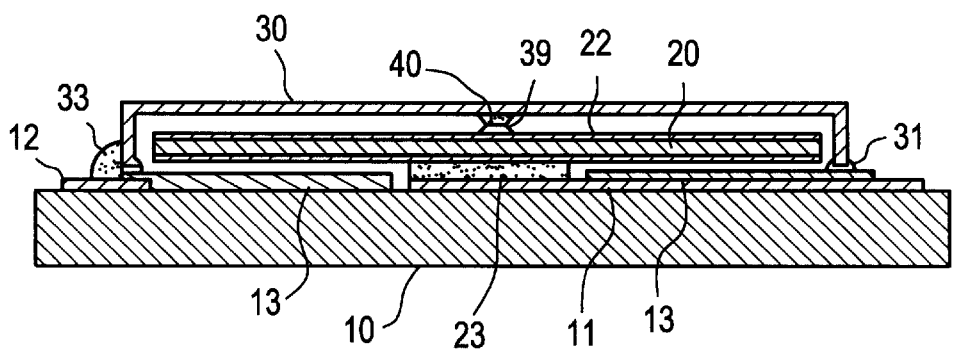
FIG. 12 is a sectional view of a seventh preferred embodiment of the electronic component in accordance with the present invention.

FIG. 12 shows an electronic component according to a seventh preferred embodiment of the present invention. In FIG. 12, the same reference numerals are used to denote the same parts or members as those of the first preferred embodiment described in connection with FIG. 6.

The seventh preferred embodiment features a substantially U-shaped wire 39 which is fixed at its both ends to a central region of the upper surface of the upper electrode 22 of the piezoelectric element 20 by a wire bonder. A conductive adhesive 40 is preferably applied to the approximate central region of the inner surface of the metallic cap 30, such that the conductive adhesive contacts the wire 39 alone when the cap 30 is placed on the substrate 10.

After the cap 30 is placed on the substrate 10, a heat treatment is conducted preferably for 30 minutes at, for example, 150° C., so that the conductive adhesive 40 is cured. Consequently, the cap 30 and the upper electrode 22 of the piezoelectric element 20 are electrically connected to each other through the wire 39 and the conductive adhesive 40. The heat curing of the conductive adhesive 40 may be executed simultaneously with the heat curing of the sealing adhesive 31 and the conductive adhesive 33.

In this preferred embodiment, the conductive adhesive 40 does not attach to the piezoelectric element 20, so that electrical characteristics of the piezoelectric element are never impaired. Fixing of both ends of the wire 39 can be conducted by a wire bonder without difficulty, because the points to which these ends of the wire are to be fixed are located at the same level or vertical height. The combination of the wire 39 and the conductive adhesive 40 provides a higher degree of reliability of the electrical connection than when the wire 39 is used alone. In addition, the influence of heat on the piezoelectric element 20 can be reduced because the heat is not directly transmitted to the piezoelectric element 20 during the heat curing of the conductive adhesive 40.

The first to seventh preferred embodiments as described are only illustrative.

For instance, while in the described preferred embodiments, a single circuit element is connected to the cap as a conductor, the arrangement may be such that a plurality of circuit elements are mounted on a substrate and associated electrodes of these circuits are interconnected by a wire which is held in contact with or electrically conducted by a conductive adhesive to the conductive portion of the cap.

The electrode of the circuit element, which is connected to the pattern electrode of the substrate through the conductive portion of the cap, may be an input/output electrode or a grounding electrode. When this electrode is a grounding electrode, the cap, if made of a metallic material can function as an electromagnetic shield.

While in the described preferred embodiments, the electrode pattern formed on the substrate has two electrodes, this is only illustrative and the preferred embodiments of the present invention do not exclude the use of three or more electrodes on the substrate.

Further, although piezoelectric devices such as filters and oscillators are specifically mentioned, the circuit element of the electronic part of the preferred embodiments of the present invention may be other types of elements such as a capacitor or may be a circuit module.

Figure 13:
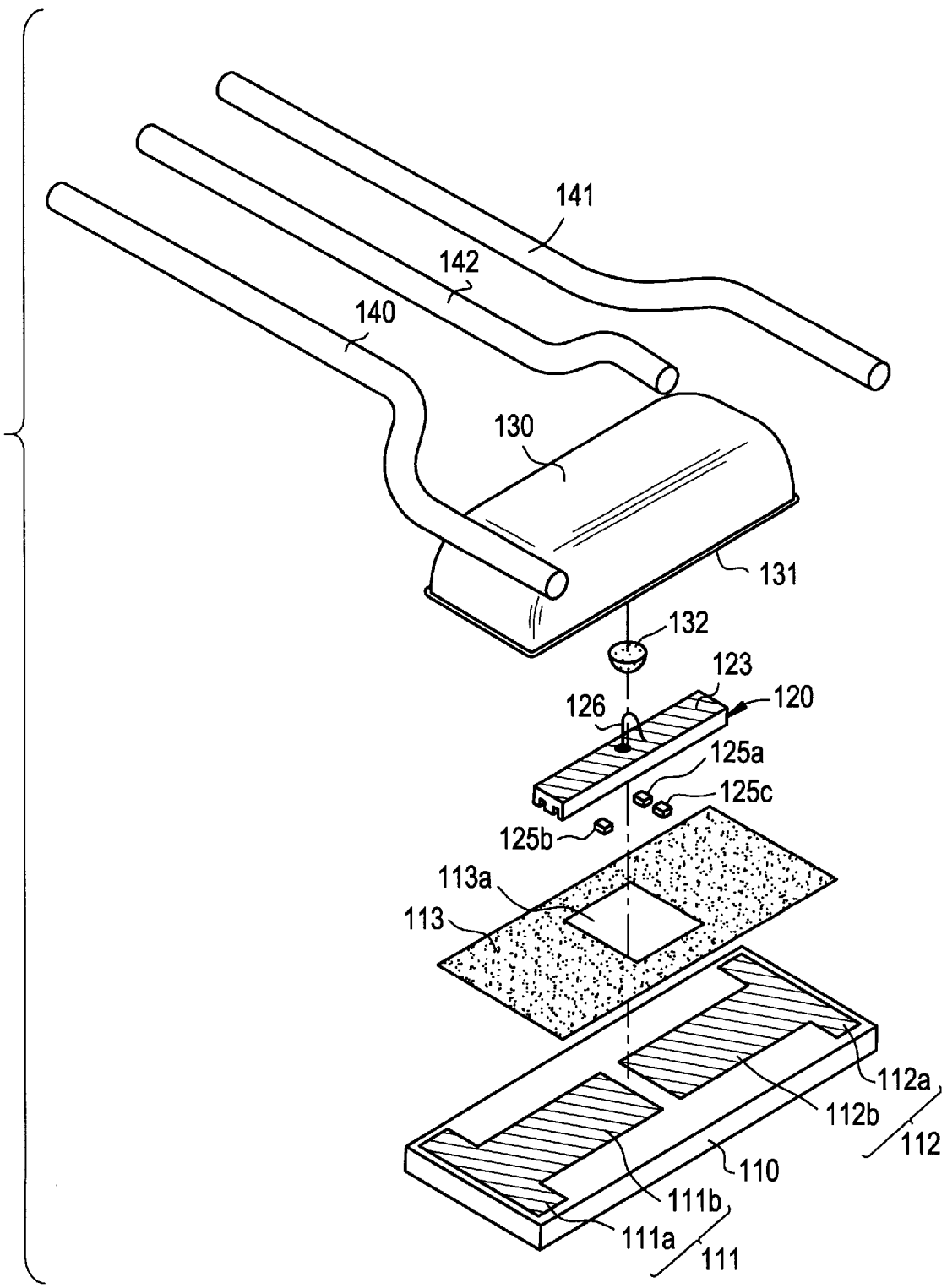
FIG. 13 is an exploded perspective view of a piezoelectric filter as an eighth preferred embodiment of the present invention.

FIG. 13 shows an AM piezoelectric filter which is a piezoelectric component according to an eighth preferred embodiment of the present invention. This piezoelectric filter includes a substrate 110, a piezoelectric element 120, a metallic cap 130 and lead terminals 140 to 142.

The substrate 110 is a substantially rectangular thin insulating plate made of alumina ceramics, glass ceramics, glass epoxy resin, or the like, and is provided at the upper surface thereof with a pair of pattern electrodes: namely, an input electrode 111 and an output electrode 112, preferably formed by a known technique such as sputtering, evaporation deposition, printing or the like. These electrodes 111 and 112 are preferably formed symmetrically. More specifically, external connecting portions 111a, 112a of these electrodes 111, 112 are preferably formed to have belt-like shapes so as to extend along the shorter sides of the substrate 10, while internal connecting portions 111b, 112b of the same extend towards the center of the substrate 10 so as to oppose each other, from the external connecting portions 111a, 112a substantially perpendicularly thereto.

A frame-shaped insulating layer 113 comprising, for example, a resist pattern is disposed on the upper surface of the substrate 110 so as to overlie portions of the electrodes 111, 112. The internal connecting portions 111b, 112b are exposed through the central opening area 113a of the insulating layer 113. The insulating layer 113 prevents shortcircuiting between the pattern electrodes 111, 112 of the substrate 110 and the metallic cap 130 and compensates for any height variation or unevenness of the surface of the substrate 10 due to thickness of the electrodes 111, 112, thereby eliminating any sealing failure of the cap 130.

The piezoelectric element 120 is preferably a piezoelectric filter element which is arranged to vibrate in, for example, the longitudinal vibration mode. The piezoelectric element 120 preferably has a substantially rectangular piezoelectric ceramics substrate 121 and electrodes 122 (referred to as "lower electrode") and 123 (referred to as "upper electrode") provided on the lower and upper surfaces of the piezoelectric ceramics substrate 121. As is seen from FIG. 14, the lower electrode 122 of the piezoelectric element 120 is preferably divided by two longitudinal grooves into three electrodes 122a, 122b and 122c. The central electrode 122b serves as an input electrode, while both side electrodes 122a, 122c serve as output electrodes. Small amounts of conductive adhesive 125a to 125c are applied to the above-mentioned electrodes 122a to 122c by a dispenser or by a suitable method such as printing. The adhesive 125b applied to the input electrode 122b is connected and fixed to the internal connecting portion 111b of one 111 of the pattern electrode. The adhesive 125a, 125c applied to the output electrodes 122a, 122c are connected and fixed to the internal connecting portion 112b of the other pattern electrode 112. It is thus possible to fix the element 120 to the substrate 110, while achieving electrical connections between the electrodes 111, 112 of the substrate 110 and the lower electrodes 122a, 122b, 122c. In order to avoid contact between both ends of the element 120 and the insulating layer 113, slight gaps are formed therebetween.

Figure 15:
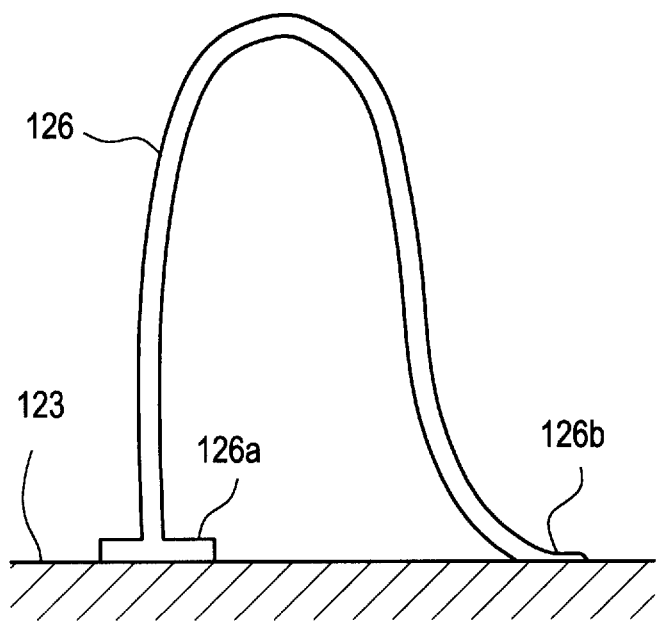
FIG. 15 is an enlarged view of the eighth preferred embodiment showing particularly the structure for securing a wire.

The upper electrode 123 is formed to cover the entire area of the upper surface of the piezoelectric element 120. A conductive wire 126 is fixed preferably by wire bonding technique to the approximate center of the upper electrode 123, i.e., preferably to a portion of the electrode 123 which is a nodal point of the longitudinal vibration. Although the illustrated preferred embodiment employs an Au wire of, for example, 30 $\mu$m diameter, any other suitable wire may be used provided that it provides required conductivity, resiliency and weather resistance. Wire bonding usually employs primary and secondary sides. In this preferred embodiment, however, both the primary side 126a and the secondary side 126b are secured to the upper electrode 123 as shown in FIG. 15, in order to obtain high levels of resiliency of the wire 126 and reliability of the connection. Thus, the wire 126 has the form of a loop with both ends thereof fixed to the upper electrode 23. The loop can have any desired height. The height, however, should be determined taking into account any fluctuation of the state of mounting of the element 120 and the dimensions of the cap 130, such that the wire 126 can be pressed against the inner surface of the cap 130 without failure. In the illustrated preferred embodiment, the height of the loop is set to about 500 $\mu$m, so that the loop is depressed or collapsed at least by about 100 $\mu$m in the assembled piezoelectric filter.

Figure 16:
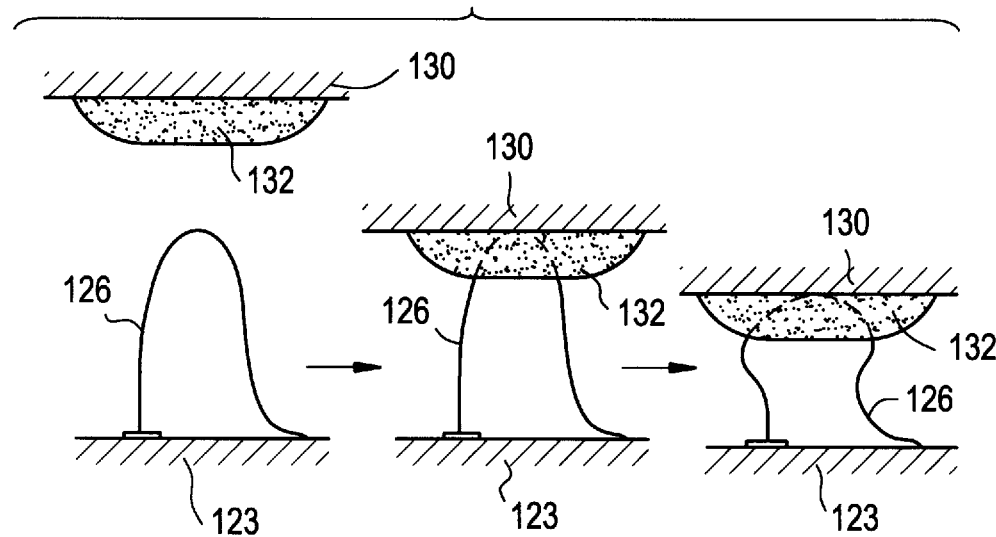
FIG. 16 is an enlarged view of the eighth preferred embodiment showing particularly the structure for connecting a wire and a cap.

The metallic cap 130 is bonded to the substrate 110 so as to cover and seal the element 120. A suitable agent such as a sealing adhesive 131 is preferably applied before hand to the opening rim of the cap 130 so as to form a layer of a uniform thickness by, for example, transferring method. At the same time, a conductive adhesive 132 has been applied, by means of a dispenser or by a suitable method such as pin-transferring method, to the inner surface of the cap 130, in particular to the portion which opposes to the wire 126 of the piezoelectric element 120. The amount of the conductive adhesive 132 to be applied should be carefully adjusted so as to provide such a thickness of the adhesive layer that the adhesive 132 makes contact with the wire 126 alone, without contacting the piezoelectric element 120. As the cap 130 is placed on the substrate 110, the opening rim of the cap 130 makes close contact with the insulating layer 113 of the substrate 110, thus sealing the interior of the cap 130. It will be seen that, when the cap 130 is placed on the substrate 110, the wire 126 cuts into the conductive adhesive 132 on the inner surface of the cap 130 and is then collapsed, as shown in FIG. 16. When heat is applied for a predetermined time in this state, the sealing adhesive 131 and the conductive adhesive 132 are cured almost simultaneously, thus accomplishing seal bonding of the cap 130 to the substrate 110 and electrical connection between the upper electrode 123 of the element 120 and the cap 130. Since the conductive adhesive 132 is spaced apart from the piezoelectric element 120, the heat is not directly transmitted from the cap 130 to the piezoelectric element 120 under the heat treatment, so that any undesirable effect of heat on the piezoelectric element 120 is reduced.

The cap 130 made of a metal also exhibits a rise of electrical resistance in accordance with lapse of time, due to oxidation of the surface. It is therefore preferred that the lower conductive portion is subjected to a surface treatment such as plating with gold. In this preferred embodiment, since the sealing adhesive 131 is electrically insulating and since the insulating layer 113 has been formed on the portion of the substrate 10 where the cap 130 is to be bonded, electrical insulation is ensured between the cap 130 and the electrode 111 of the substrate 110.

Input/output lead terminals 140, 141 are connected preferably by soldering to the external connecting portions 111a, 112a of the pattern electrodes 111, 112 of the substrate 110. A grounding lead terminal 142 is fixed to the external surface of the cap 130 by soldering or welding. When it is desired that the input and output terminals 140, 141 not be in close proximity to the cap 130, it is advisable that the external connecting portions 111a, 112a of the pattern electrodes 111, 112 extend to the underside or bottom surface of the substrate 110 and the input and output lead terminals 140, 141 are fixed to these extended portions of the electrodes 111, 112. The grounding lead terminal 142 may be connected to the cap 130 in advance of the bonding of the cap 130 to the substrate 110.

Figure 17:
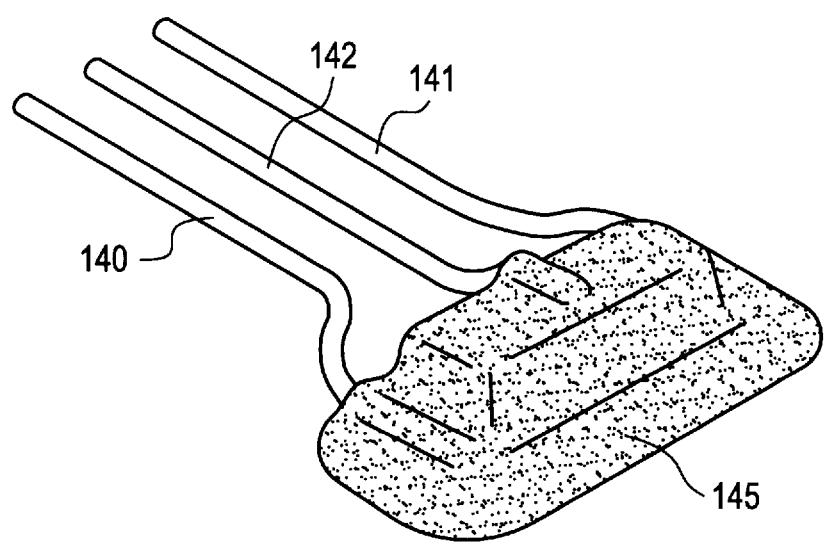
FIG. 17 is a perspective view of the piezoelectric filter with an external cover attached thereto.

After the lead terminals 140 to 142 are connected, an external coating 145 is provided so as to integrally cover the cap 130 and the substrate 110, thus completing the piezoelectric component as the product as shown in FIG. 17.

In the piezoelectric component of this preferred embodiment, the grounding electrode, i.e., the upper electrode 123, of the piezoelectric element is electrically connected to the cap 130 via the wire 126, and the cap 130 is electrically connected to the grounding lead terminal 142. This eliminates the necessity for a grounding electrode to be formed on the substrate 110, thus contributing to reduction in the size of the substrate 110 and simplification of the process for achieving electrical connections. In addition, the described preferred embodiment does not require any wiring which is used in conventional devices for the electrical connection between the grounding electrode on the substrate and the piezoelectric element. It is therefore possible to eliminate problems attributable to use of the wiring, such as difficulty encountered in setting optimum bonding condition attributable to difference in the levels or vertical locations of the points to which the wire is to be bonded, as well as troubles such as cutting or sagging down of the wire. The elimination of the wiring also allows the cap to have a reduced size, because there is no need for providing a wiring space inside the cap.

Figure 18:
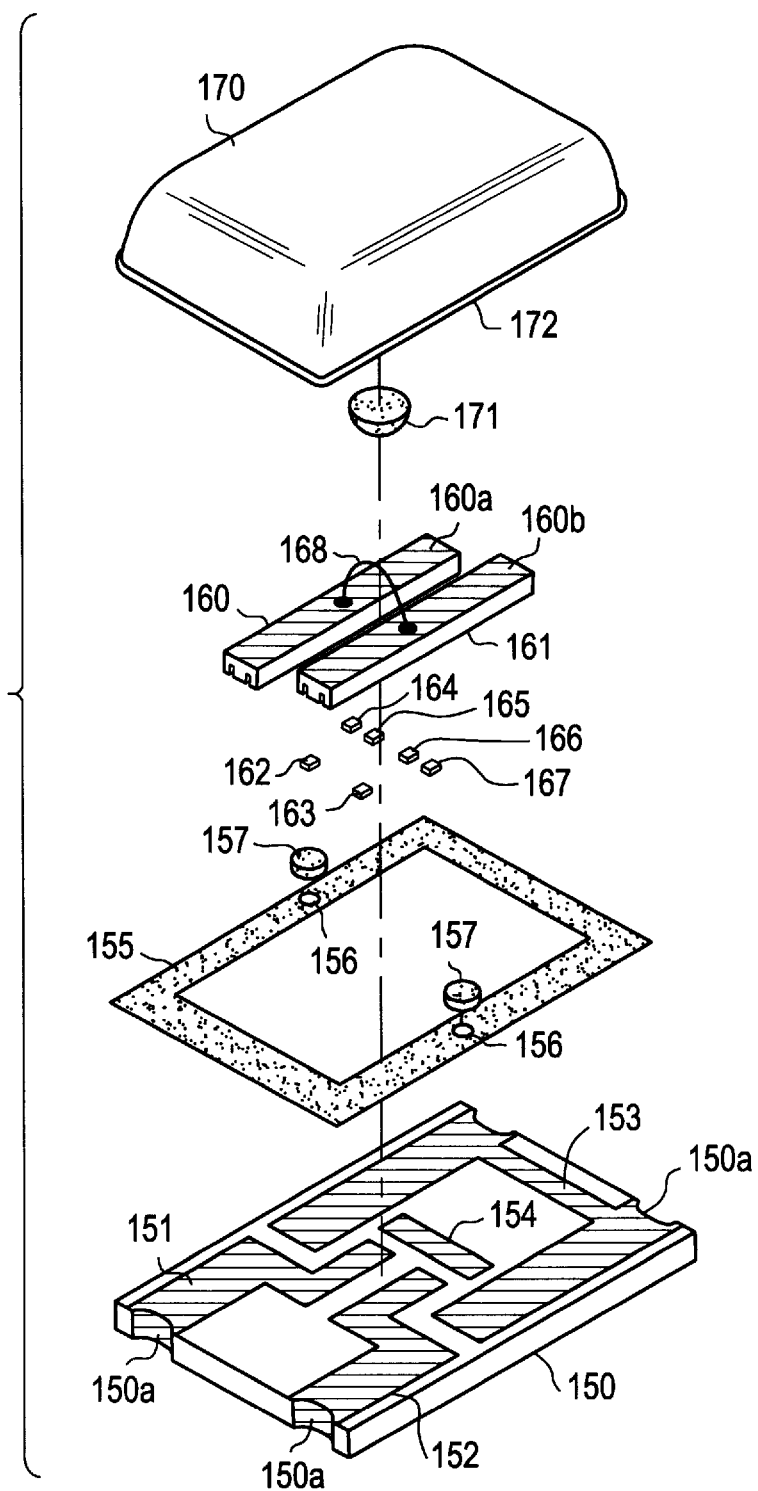
FIG. 18 is an exploded perspective view of a piezoelectric filter as a ninth preferred embodiment of the present invention.

FIG. 18 shows a surface-mount type piezoelectric filter incorporating a pair of piezoelectric elements, according to a ninth preferred embodiment of the present invention.

A substrate 150 has a pattern electrode 151 for input, a pattern electrode 152 for output, a pattern electrode 153 for grounding, and an intermediate electrode 154. The input, output and grounding pattern electrodes 151 to 153 respectively extend to the underside or bottom surface of the substrate 150, preferably through grooves 150a formed in side edges of the substrate 150. A frame-shaped insulating layer 155 is preferably disposed on the portion of the substrate 150 where the cap is to be bonded. Apertures 156 are formed in two opposing sides of the frame-shaped insulating layer 155, more specifically at portions corresponding to the grounding electrode 153. A conductive adhesive 157 is preferably applied to each of the apertures 156.

The piezoelectric filter incorporates a pair of piezoelectric elements 160, 161 each of which preferably is adapted to vibrate in a longitudinal vibration mode. As in the case of the eighth preferred embodiment shown in FIG. 14, the lower electrode (not shown) formed on the lower side of each piezoelectric element is preferably segmented into three electrodes by a pair of longitudinal grooves. The central electrodes, which correspond to the central electrode 122b shown in FIG. 14, of the respective piezoelectric elements 160, 161 are connected to the input pattern electrode 151 and the output pattern electrode 152 of the substrate 150, by means of islands 161, 163 of conductive adhesive, respectively. Both side electrodes, corresponding to the electrodes 122a, 122c shown in FIG. 14, of the piezoelectric elements 160, 161 are connected to the intermediate electrode 154 by means of islands 164 to 167 of conductive adhesive. Thus, the pair of piezoelectric elements 160 and 162 are cascade-connected between the input electrode 151 and the output electrode 152. The upper electrodes 160a, 160b of the piezoelectric elements 160 and 161 are connected to each other by a bridge-like single wire 168. This wire 168 also is formed by using wire bonding technique, as in the eighth preferred embodiment.

The cap 170 preferred has a size large enough to simultaneously cover both piezoelectric elements 160, 161. A conductive adhesive 171 is applied to the inner surface of the cap 170, particularly to a portion where the inner surface is to be contacted by the wire 168. A sealing adhesive 172 is applied to the entire opening rim of the cap 170, so that the opening rim of the cap 170 is bonded to the substrate 150 as the cap 170 is pressed onto the substrate 150. In the course of the bonding of the cap rim to the substrate 150, part of the sealing adhesive 172 is displaced by the conductive adhesive 157 which has been applied to the apertures 156 and the opening rim of the cap 170 cuts into the conductive adhesive 157. At the same time, the top portion of the bridge-like wire 168 cuts into the conductive adhesive 171 which has been applied to the inner surface of the cap 170, while the wire 168 is partially depressed or collapsed. In this state, heat is applied so that the sealing adhesive 172 and the adhesive islands 157, 162 to 167 and 171 of the conductive adhesive are cured almost simultaneously, thus accomplishing sealing of the interior of the cap 170, while establishing the required electrical connections. Namely, the upper electrodes 160a, 160b of the piezoelectric elements 160, 161 are connected through the wire 168 to the cap 170 which in turn is connected to the grounding electrode 153 through the conductive adhesive 157. Consequently, the upper electrodes 160a, 160b of the piezoelectric elements 160, 161 are brought into electrical connection with the grounding electrode 153.

In the ninth preferred embodiment as described, a single wire 168 serves to interconnect the upper electrodes of the pair of piezoelectric elements 160, 161 to each other and also to connect these upper electrodes to the cap 170. Such an arrangement, however, is not exclusive and the arrangement may be such that a single loop-shaped wire is used for each of the piezoelectric elements 160, 161. The ninth preferred embodiment as described, however, is advantageous in that it used only one wire and, hence, reduces the steps of the work for achieving the connection.

In the described ninth preferred embodiment, a conductive adhesive 157 is preferably applied beforehand to the substrate 150, in order to achieve electrical connection between the cap 170 and the grounding electrode 153. However, the preferred ninth embodiment may be modified such that the grounding electrode 153 and the external surface of the cap 170 may be connected by a conductive adhesive or a solder, after bonding the cap 170 to the substrate 150 via the sealing adhesive 172. Other suitable bonding process also may be employed.

Although a surface-mount type piezoelectric part has been described in the ninth preferred embodiment, a lead terminal type piezoelectric part can be obtained by connecting, as in the eighth preferred embodiment, a lead terminal to the cap 170, while connecting lead terminals to the input and output terminals 151, 152. In this case, it is not necessary to form a grounding electrode 153 on the substrate 150. The apertures 156 formed in the sides of the insulating layer 155 and the conductive adhesive 157 also can be eliminated when the piezoelectric component is constructed to have such a lead-terminal type structure.

The structure of the ninth preferred embodiment may be applied to a piezoelectric component which incorporates only one piezoelectric element. In such an application, an input electrode, an output electrode and a grounding electrode are disposed on the substrate 150, and the electrode on the lower surface of the single piezoelectric element is commonly connected and fixed to the input and output electrodes by a conductive adhesive, while the electrode on the surface of the piezoelectric element is connected by a wire to the cap which in turn is connected to the grounding electrode by means of, for example, a conductive adhesive.

The eighth and ninth preferred embodiments are only illustrative and may be modified in various forms.

For example, the use of a conductive adhesive for achieving connection between the piezoelectric element 120 and the substrate 110 is not exclusive and may be substituted by any other known suitable connecting member or substance.

Figure 14:
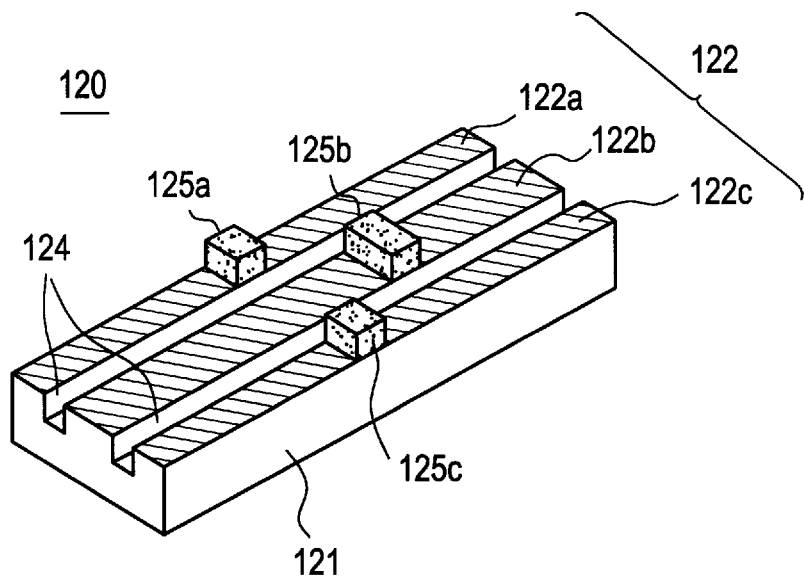
FIG. 14 is a perspective view of the lower side of a piezoelectric element.

The configuration of the lower electrode 122 of the piezoelectric element 120 shown in FIG. 14 also is illustrative. For instance, instead of segmenting the electrodes into three electrodes by two longitudinal grooves as illustrated, the electrode may be split into two electrodes by a single longitudinal groove, or a single solid lower electrode may be used without any dividing groove. Thus, the eighth and ninth preferred embodiments can be used not only for piezoelectric parts of the type having three electrodes but also to piezoelectric parts of the type having two terminals.

In these preferred embodiments, the upper electrode of the piezoelectric element connected to the cap serves as a grounding electrode, so that the metallic cap plays also the role of an electromagnetic shield. However, the described preferred embodiments may be modified such that the upper electrode of the piezoelectric element connected to the cap serves as an electrode for purposes other than grounding.

Furthermore, the eighth and ninth preferred embodiments are applicable also to oscillators, although piezoelectric filters have been specifically described.

As will be understood from the foregoing description, in the eighth and ninth preferred embodiments of the present invention, the electrical connection between the upper electrode of the piezoelectric element and the cap is achieved by pressing the wire fixed to the upper electrode into contact with the inner surface of the cap. Therefore, any thermal stress occurring due to difference in thermal expansion between the piezoelectric element and the cap can effectively be absorbed by the resiliency or elasticity of the wire, so that a high degree of reliability of electrical conduction is ensured. The resiliency or elasticity of the wire also serves to accommodate any fluctuation in the size of the gap between the cap and the piezoelectric element, thus affording a greater tolerance for administration of dimensions. Furthermore, the wire, unlike the conductive adhesive which tends to spread over a wide area, can be fixed only to a limited portion of limited area on the piezoelectric element, such as the nodal point or its vicinity, thus posing minimum risk of impeding vibration of the piezoelectric element.

Figure 19:
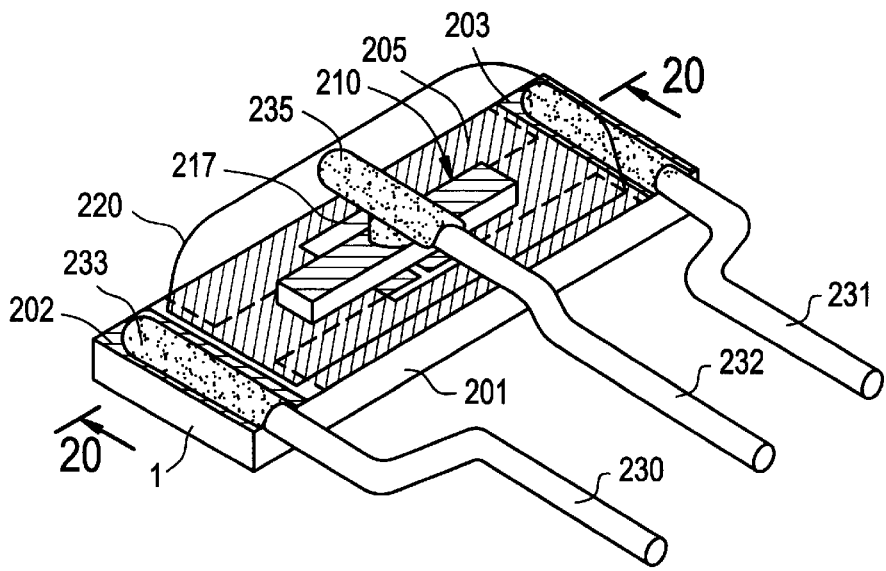
FIG. 19 is a perspective view of a tenth preferred embodiment of the present invention.
Figure 20:
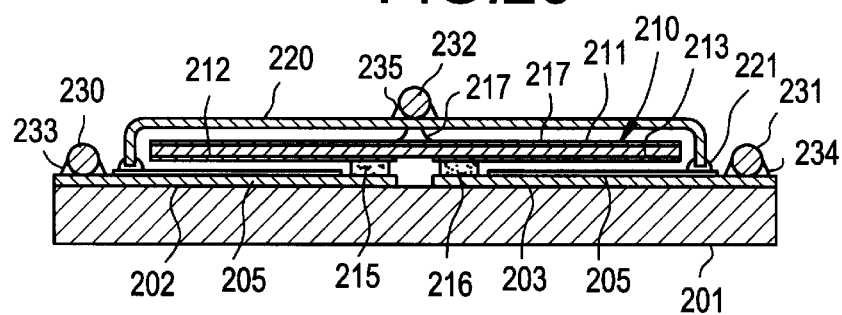
FIG. 20 is a sectional view of the tenth preferred embodiment, taken along the line B—B of FIG. 19.

FIGS. 19 and 20 show a tenth preferred embodiment of the present invention.

In this preferred embodiment, a substrate 201 preferably has only two patterned electrodes: namely, a pattern electrode 202 for input and a pattern electrode 203 for output which extend externally out of a metallic cap 220. Lead terminals 230, 231 are connected to these externally led portions of the electrodes 202, 203 by soldering as at 233 and 234. An upper electrode 211 of the piezoelectric element 210 is connected to the inner surface of the metallic cap 220 by a conductive adhesive 217, while a grounding lead terminal 232 is connected to the external surface of the cap 220 by solder 235. The grounding lead terminal 232 is bent in the thicknesswise direction of the substrate 201, so that the lead portions of the thee lead terminals 230 to 232 are arranged in a in-line manner.

In this preferred embodiment also, the substrate 201 and the cap 220 are preferably surrounded and coated integrally by a coating resin (not shown).

In this tenth preferred embodiment, it is not necessary to form, in one side edge of the substrate 201, a portion which would enable connection of the lead terminals 230 to 232. In addition, the pattern electrode for the grounding purpose can be eliminated. It is therefore possible to reduce the dimensions, particularly the height, of the substrate 1. In addition, since the metallic cap 220 is used as a wiring for interconnecting the upper electrode 211 of the piezoelectric element 210 and the lead terminal 232, and since a conductive adhesive 217 is used in place of conventional bonded wire, it is possible to eliminate the wire boding operation, while reducing impact applied to the element 210.

In place of the conductive adhesive 217 mentioned above, it is possible to use other suitable connecting member or substance such as a wire, conductive tape, solder, metallic spring or the like, independently or in combination, for the purpose of interconnecting the upper electrode 211 of the piezoelectric element 210 and the metallic cap, depending on the size of the clearance between the electrode 211 and the cap 220.

Figure 21:
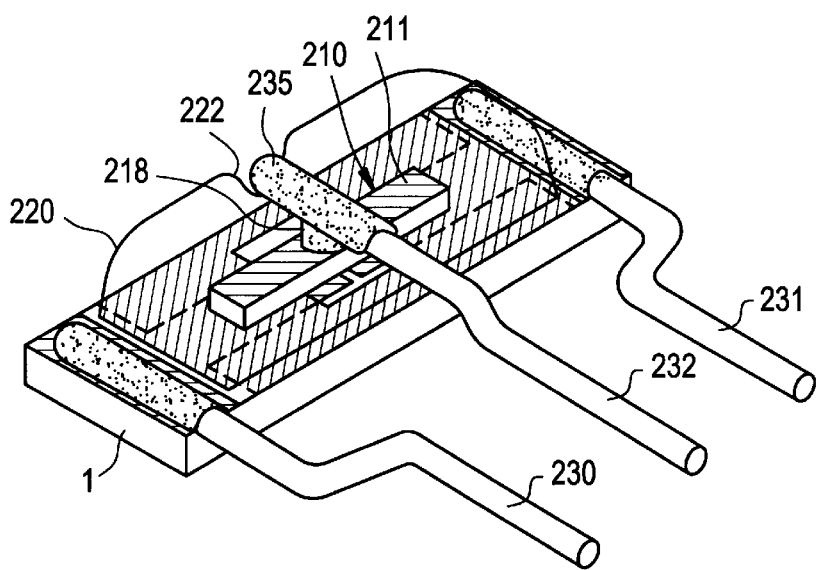
FIG. 21 is a perspective view of a modification of the tenth preferred embodiment.

FIG. 21 shows a modification of the tenth preferred embodiment. In this modification, the top central portion of the wall of the metallic cap 220 is recessed inward and downward as at 220, and the grounding lead terminal 232 is received in this recess and then soldered as at 235. The soldering can easily be performed because the lead terminal 232 is stably held in the recess 222 during the soldering. The inward and downward recess 222 provides a corresponding inward and downward projection projecting inward from the top of the cap. A cream solder 218 may be applied to this projection. After the cap 220 is placed on the substrate 201, the cap is heated to the melting point of the solder, so that the upper electrode 211 of the element 210 can easily be brought into electrical connection with the cap 220. Obviously, the cream solder may be substituted by a conductive adhesive such as that used in the tenth preferred embodiment.

In this modification, the overall height or thickness of the electronic part can be reduced because the lead terminal 232 is fitted in the recess 222. In addition, the conductive agent (solder or conductive adhesive) 218 concentrates to the projection, so that undesirable spreading of the agent 218 over the wide area on the element 210 can be avoided, despite any variation in the amount of the conductive agent applied and in the size of the clearance between the cap 220 and the upper electrode 211 of the element 210.

Figure 22:
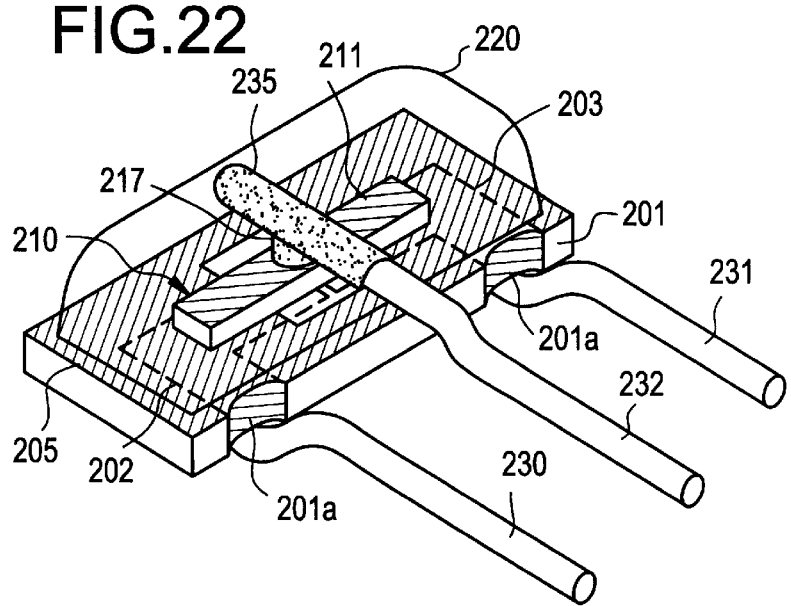
FIG. 22 is a perspective view of another modification of the tenth preferred embodiment.
Figure 23:
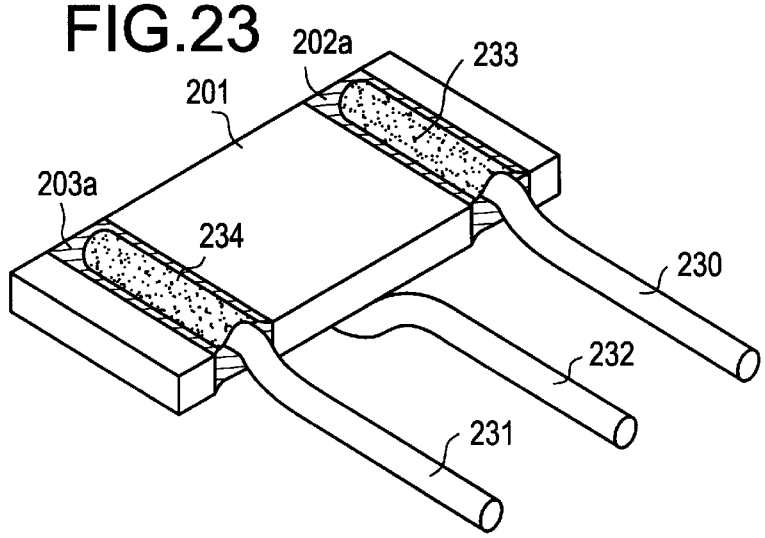
FIG. 23 is a perspective view of the lower surface of the electronic part shown in FIG. 22.
Figure 24:
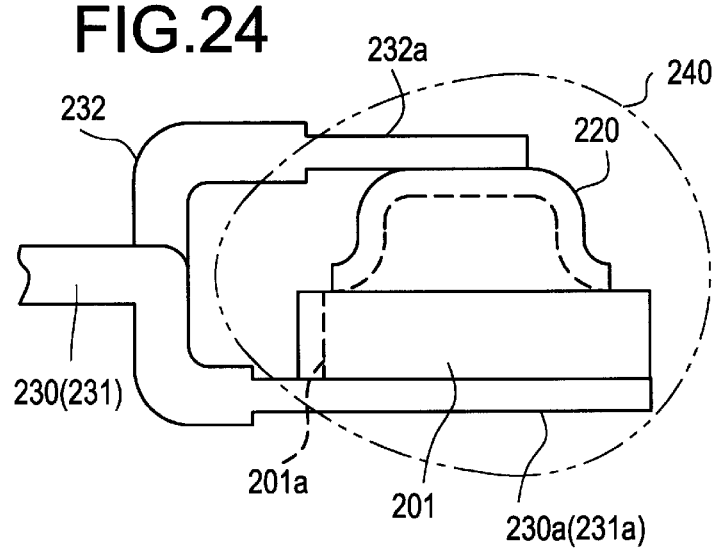
FIG. 24 is a fragmentary side elevational view of the electronic part shown in FIG. 22.

FIGS. 22 to 24 show another modification of the tenth preferred embodiment. Only two pattern electrodes 202, 203: namely, an input pattern electrode 202 and an output patterned electrode 203, are disposed on the substrate 201. The outer ends of the electrodes 202 and 203 are extended to the underside or bottom surface of the substrate 201 via through-hole grooves 201*a* formed in a side edge of the substrate 201. Input and output lead terminals 230 and 231 are soldered to the ends 202*a* and 203*a* of the electrodes 202 and 203 which extend to the underside of the substrate 1. A grounding lead terminal 232 is soldered as at 235 to the upper surface of the metallic cap 220. The cap 220 may be provided at its top with a recess for receiving the lead terminal 232 as in the first modification described before.

The lead terminals 230 to 232 preferably have a round cross-section and the ends 230*a* to 232*a* of these terminals are preferably collapsed and flattened as shown in FIG. 24, thus facilitating soldering to the electrodes 202, 203 and the cap 220. In order that the lead terminals 230 to 232 are arranged in an in-line fashion, the input and output lead terminals 230 and 231 are bent upward, while the grounding lead terminal 232 is bent downward. The substrate 201 and the cap 220 are surrounded and integrally dip-coated with external coating resin 240. The bent portions of the lead terminals 230 to 232 serve as a bank which prevents spreading of the coating resin 40 to the outer side of the leads beyond these bent portions. When the electronic component (piezoelectric filter) is mounted on a printed circuit board with the lead terminals inserted into corresponding holes formed in the printed circuit board, these bent portions of the lead terminals effectively serve to regulate the depth of insertion of the lead terminals by abutting edges of the holes at the upper surface of the printed circuit board. It is therefore possible to accurately regulate the position of mounting of the electronic part on the printed circuit board.

In this modification of the tenth preferred embodiment, the connection of the input and output lead terminals 230, 231 is made at the underside of the substrate 201, so that the longitudinal dimension of the substrate 201 can be further reduced beyond that in the first modification described before in connection with FIG. 21, thus contributing to a further reduction in the size of the substrate 201. In addition, since the substrate 201 and the cap 220 are sandwiched at their upper and lower sides by the three lead terminals 230 to 232, it is possible to temporarily hold the electronic part by these lead terminals before and during the soldering, thus offering improved efficiency of the soldering. In addition, since a sufficiently large distance is preserved between the cap 220 and the input and output lead terminals 230, 231, the risk of shortcircuiting between these lead terminals and the cap can be further reduced.

The described tenth preferred embodiment and its modifications are only illustrative. For instance, the piezoelectric element may be of the type which has only one electrode on each of the upper and lower surfaces thereof, although the piezoelectric element used in the tenth preferred embodiment has two electrodes provided on the lower surface and one electrode on the upper surface of the piezoelectric element. The circuit element may also be an element other than a piezoelectric element such as a piezoelectric resonator. Namely, the circuit element may be a capacitor or the like element, or may be a circuit module. Obviously, the electronic part to which the preferred embodiments of the present invention is applied may be other electronic part than a piezoelectric filter, e.g., a piezoelectric oscillator.

The number of the lead terminals also may be changed depending on the number of the circuit elements and the number of the electrodes. For example, the electronic part may have only two lead terminals, or three or more lead terminals.

As will be understood from the foregoing description, according to the tenth preferred embodiment and its modifications, a cap is bonded to the substrate carrying a circuit element, so as to completely seal the circuit element, without using any case having openings for passing lead terminals. It is therefore possible to easily produce an electronic part having lead terminals and completely sealing a circuit element, whereby electronic parts are obtained at reduced costs of production.

The element is mounted on the substrate, while the lead terminals are connected to the substrate or the cap. Namely, the lead terminals are not directly connected to the circuit element, so that no substantial load is applied to the circuit element. This conveniently reduces the risk of breakage of the element, contributing to improvement in the throughput.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An electronic component comprising:

a substrate having a pattern electrode disposed thereon;

a circuit element mounted on said substrate and including at least one electrode; and a cap connected to said substrate so as to cover and seal said circuit element and so as to define a sealed inner cavity between said substrate and a periphery of said cap and such that said pattern electrode on said substrate extends outside of said cap and said sealed inner cavity; wherein a conductive portion is provided on said cap and is made of electrically conductive metal, said conductive portion being connected to said at least one electrode of said circuit element at a location inside of said cap and said sealed inner cavity and connected to said pattern electrode on said substrate at a location outside of said cap and said sealed inner cavity, whereby said at least one electrode of said circuit element is electrically connected to said pattern electrode on said substrate through said conductive portion of said cap.

2. An electronic component according to claim 1, wherein said circuit element is an element which uses piezoelectric vibration and said conductive portion of said cap is connected to a portion of said at least one electrode of said circuit element near a nodal point of piezoelectric vibration.

3. An electronic component, comprising:

a substrate having at least first and second electrodes disposed on a surface thereof;

a circuit element having first and second electrodes each disposed on one of upper and lower surfaces thereof, said first electrode of said circuit element being disposed on the lower surface and being electrically connected to said first electrode disposed on said substrate; and a cap connected to said substrate so as to cover and seal said circuit element and so as to define a sealed inner cavity between said substrate and a periphery of said cap and such that said second electrode on said substrate extends outside of said cap and said sealed inner cavity; wherein a conductive portion is provided on said cap and is made of electrically conductive metal, said conductive portion being electrically connected to said second electrode of said circuit element which is disposed on the upper surface of said circuit electrode at a location inside of said cap and said sealed inner cavity and also to said second electrode of said substrate at a location outside of said cap and said sealed inner cavity, whereby said first electrode of said circuit element disposed on the upper surface of said circuit element is electrically connected to said second electrode of said substrate through the conductive portion of said cap.

4. An electronic component according to claim 3, wherein said circuit element is an element which uses piezoelectric vibration and said conductive portion of said cap is connected to a portion of one of said first and second electrodes of said circuit element near a nodal point of piezoelectric vibration.

5. A piezoelectric component, comprising:

a substrate having a least one electrode disposed on an upper surface thereof;

a piezoelectric element having first and second electrodes each disposed on one of upper and lower surfaces thereof, the piezoelectric element being mounted on said substrate, said first electrode being disposed on the lower surface of said piezoelectric element and being electrically connected to said at least one electrode disposed on said substrate;

a cap connected to said substrate so as to cover and seal said piezoelectric element; and a conductive wire provided on said second electrode of said piezoelectric element which is disposed on the upper surface of said piezoelectric element, the conductive wire being arranged to have a loop configuration with both ends of the wire loop being connected to one of said second electrode and said cap and a curved portion of said wire loop located between both ends of said wire loop being disposed in contact with the other one of said second electrode and said cap;

said cap being arranged so as to cover said piezoelectric element while making contact at the inner surface thereof with said conductive wire, whereby said second electrode disposed on the upper surface of said piezoelectric element is electrically connected to said cap through said conductive wire.

6. A piezoelectric component according to claim 5, wherein a conductive adhesive is located at a portion of the inner surface of said cap so as to contact said conductive wire.

7. A piezoelectric component according to claim 4, wherein said one of said first and second electrodes of said substrate extends externally through a region where said cap is bonded to said substrate, said piezoelectric component further comprising a first lead terminal connected to an externally led portion of said at least one electrode of said substrate and a second lead terminal connected and fixed to an outer surface of said cap.

8. A piezoelectric component according to claim 4, wherein said substrate has an input/output electrode and a grounding electrode disposed thereon, said input/output electrode and said grounding electrode extending externally through a region where said cap is connected to said substrate, said first electrode of said piezoelectric element disposed on the lower surface of said piezoelectric element being connected to said input/output electrode, said cap being connected to the grounding electrode.

9. An electronic component, comprising:

a substrate having pattern electrodes disposed thereon;

a circuit element mounted on the surface of said substrate and having electrodes electrically connected to said pattern electrodes;

a cap bonded to the surface of said substrate so as to cover and seal said circuit element and so as to define a sealed inner cavity between said substrate and a periphery of said cap and such that said second electrode on said substrate extends outside of said cap and said sealed inner cavity; and lead terminals electrically connected to portions of said pattern electrodes which extend externally of said cap; wherein said cap is made of an electrically conductive material and is electrically connected to one of the electrodes of said circuit element and with at least one of said lead terminals at a location outside of said cap and said sealed inner cavity.

10. A connecting structure for an electronic component, comprising:

an electronic component having an electrode disposed thereon;

a loop wire disposed on said electrode such that both ends of said loop wire are connected to said electrode;

a cap for covering said electronic component, the cap being electrically connected to said loop wire, said loop wire being arranged such that a curved portion of said loop wire located between said both ends of said loop wire is arranged to physically contact said cap; and a conductive member located between said cap and said curved portion of said loop wire to electrically connect said loop wire to said cap.

11. An electronic component according to claim 1, wherein said pattern electrode is disposed along only one surface of said substrate.

12. An electronic component according to claim 1, further comprising an adhesive located at a point where said cap and said pattern electrode contact each other.

13. An electronic component according to claim 1, wherein said cap includes a projection which extends toward said circuit element and is disposed in contact with said at least one electrode of said circuit element.

14. An electronic component according to claim 3, wherein said pattern electrode is disposed along only one surface of said substrate.

15. An electronic component according to claim 3, further comprising an adhesive located at a point where said cap and said pattern electrode contact each other.

16. An electronic component according to claim 3, wherein said cap includes a projection which extends toward said circuit element and is disposed in contact with said at least one electrode of said circuit element.

* * * * *